United States Patent [19]

Flamm

[11] 4,400,693
[45] Aug. 23, 1983

[54] MOS PARALLEL A/D CONVERTER

[75] Inventor: Peter M. Flamm, Freiburg, Fed. Rep. of Germany

[73] Assignee: ITT Industries, Inc., New York, N.Y.

[21] Appl. No.: 326,637

[22] Filed: Dec. 2, 1981

[30] Foreign Application Priority Data

Dec. 11, 1980 [EP] European Pat. Off. .......... 80107811

[51] Int. Cl.³ .......................................... H03K 13/175
[52] U.S. Cl. ...................... 340/347 AD; 340/347 CC; 358/13
[58] Field of Search ................. 340/347 AD, 347 CC, 340/347 SH; 358/13, 141; 328/162; 307/360, 361; 324/99 D

[56] References Cited

U.S. PATENT DOCUMENTS

| | | | |
|---|---|---|---|
| 3,747,089 | 7/1973 | Sharples | 340/347 AD |
| 3,982,241 | 9/1976 | Lipcon | 340/347 CC |
| 4,110,745 | 8/1978 | Ninomiya | 340/347 AD |

OTHER PUBLICATIONS

Dingwall "IEEE Journal of Solid-State Circuits" vol. SC-14, No. 6, Dec. 1979, pp. 926-932.

*Primary Examiner*—C. D. Miller
*Attorney, Agent, or Firm*—John T. O'Halloran; Peter C. Van Der Sluys

[57] ABSTRACT

For the dynamic compensation of the offset voltage in such converters each non-inverting comparator input (+) is connected via a first transfer transistor (T11, T12, T1p) to the signal input (SE) and via a second transfer transistor (T21, T22, T2p) to the associated voltage divider tap of the voltage divider as applied to the reference voltage (Ur). Moreover, each inverting comparator input (−), via capacitor (C1, C2, Cp) is applied to the associated voltage divider tap and, via a third transfer transistor (T31, T32, T3p) and across a resistor (R'1, R'2, R'p) arranged in series therewith, to the associated comparator output. The second and third transfer transistors are rendered conductive during short intervals (T) between conversions by the clock signal (F), and the first transfer transistors are rendered non-conductive via the inverter (IV), and during the conversion time (t) the first transfer transistors are rendered conductive, and the second and third transfer transistors are rendered non-conductive. In television receivers, such MOS parallel A/D converters are suitable for processing the video signal, in which case the line sweep period serves as the conversion time (t), and the line fly-back period serves as the interval (T) between conversions.

2 Claims, 1 Drawing Figure

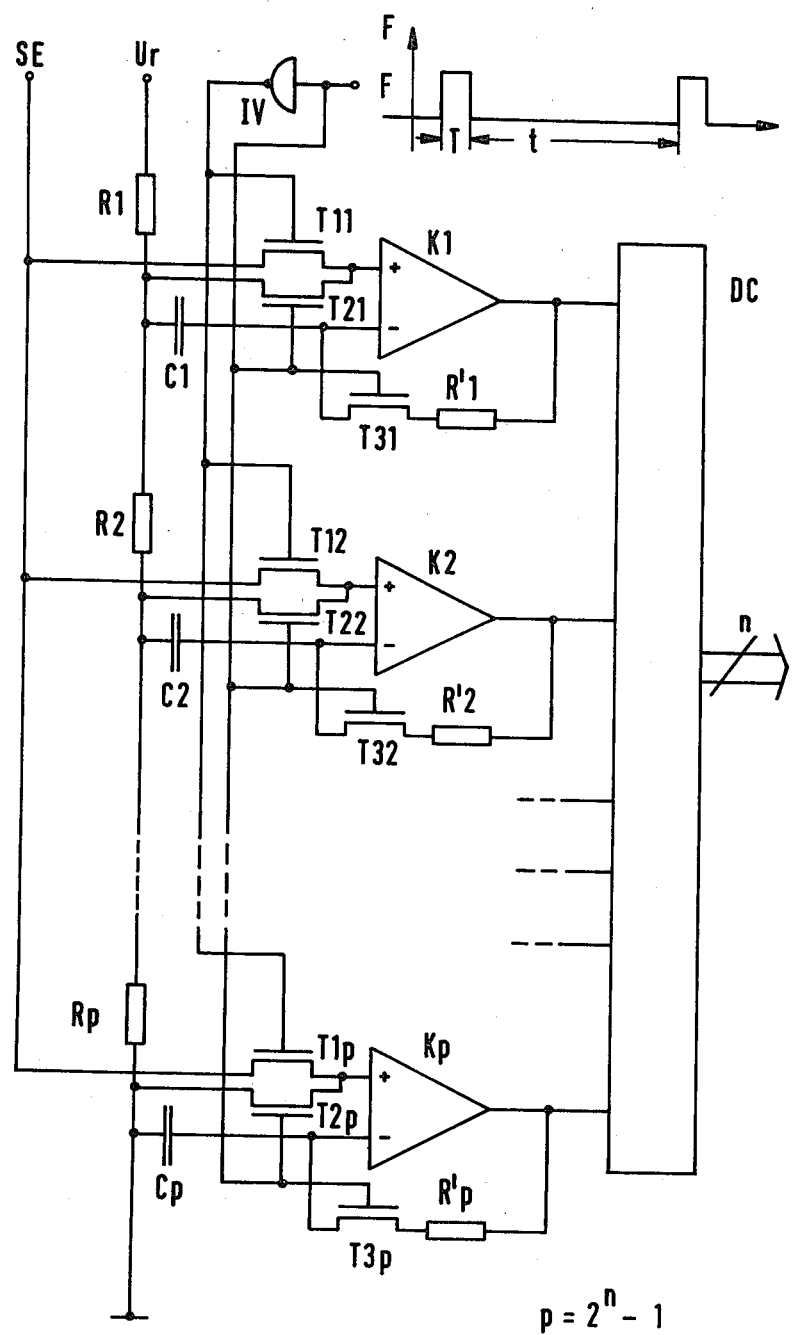

MOS PARALLEL A/D CONVERTER

The invention relates to monolithic integrated parallel analog-to-digital converters employing insulated-gate field-effect transistors, briefly referred to as MOS parallel A/D converters.

According to the book by D. F. Hoeschele "Analog-to-Digital/Digital-to-Analog-Conversion Techniques", New York, 1968, pp. 10, 249, 253 to 259 and 409 to 412, such MOS parallel A/D converters consist of $p = 2^n - 1$ comparators, of a voltage divider consisting of p or $p-1$ resistors and applied to a reference voltage, and of a decoder part connected to the outputs of the comparators. Relative thereto, n indicates the number of binary positions of the digital converter output signal. All comparator inputs of the one kind, hence the non-inverting inputs are connected to the signal input, and the comparator inputs of the other kind, hence for example, the inverting inputs, are each connected to one tapping point of the voltage divider.

In realizing such MOS parallel analog-to-digital converters the offset voltage differences of the individual comparators are noticed disadvantageously, which must be substantially smaller than the voltage element belonging to the least significant bit which, as a rule, is equal to the voltage drop across one of the voltage dividing resistors. For the purpose of numerically illustrating this problem it be assumed that a 7-bit converter which, accordingly, includes 127 comparators, and the voltage divider thereof are being operated from a 5 V reference voltage, so that the aforementioned voltage element amounts to about 40 mV. In that case, the differences of the offset voltages may amount in the utmost to about ±2.5 mV. Such small offset voltage differences, however, if at all, are only very difficult to realize.

This is intended to be remedied by the invention. The invention as characterized in the claims, solves the problem of designing the MOS parallel A/D converters, from a circuit-technical point of view, in such a way that by it the offset voltage differences are compensated dynamically.

The advantages obtained by the invention compulsorily result from the solution to the problem so that it is now possible to realize fast MOS parallel A/D converters of high resolving power. In particular, it becomes possible to provide MOS parallel A/D converters for processing the video signals occurring in television receivers, so that the invention can be preferably used in connection with such types of television receivers.

The invention will now be described in greater detail with reference to the accompanying drawing showing a schematic circuit diagram relating to a preferred example of embodiment in the form of a block diagram. According to the number n of the binary positions of the converter output signal which is capable of being taken off the output of the decoder part DC, there are provided $p = 2^n - 1$ comparators K1, K2, Kp which, for example, may also consist of operational amplifiers, differential amplifiers or Schmitt triggers, with the outputs thereof being connected to the parallel input of the decoder part DC.

Each non-inverting input + of the comparators K1-Kp is applied via the controlled current path of the first transfer transistor T11, T12, T1p, to the signal input SE. Moreover, the non-inverting input, via the controlled current path of the second transfer transistor T21, T22, T2p, is applied to the associated voltage-divider tapping point. This voltage divider consists of the voltage-dividing resistors R1, R2, Rp and is applied to the reference voltage Ur. Accordingly, in the drawing the second transistor T21 is shown to be applied to the point connecting the resistors R1, R2, the second transistor T22 is shown to be applied to the point connecting the resistor R2 to the next voltage-dividing resistor (not shown in the drawing), and the second transistor T2p is shown to be applied to the point connecting the last resistor Rp of the voltage divider to the zero point of the circuit.

To each of the just mentioned voltage-divider taps there is also applied one each of the capacitances C1, C2, Cp, with the respective other terminals thereof being applied to the inverting input of the associated comparator K1, K2, Kp. As such capacitances there are advantageously used MOS capacitors which are then included in the integrated circuit. It is also possible, however, to realize these capacitances with the aid of other capacitors or else with the aid of capacitors to be connected to the integrated circuit from the outside.

From the output of each comparator K1, K2, Kp a feedback loop extends to the associated inverting input consisting of the resistor R'1, R'2, R'p and of the controlled current path of the respective third transfer transistor T31, T32, T3p arranged in series therewith. The one end of the controlled current path of the respective third transfer transistor, accordingly, is also applied to the one terminal of the corresponding capacitor C1, C2, Cp.

The gates of the second and third transfer transistors T21, T31; T22, T32; T2p, T3p as associated with the respective comparator K1, K2, Kp are connected with each other and are applied to a clock signal F switching them to the conducting state only during a short interval T between conversions, with the curve of this clock signal F, as a function of time, being schematically denoted in the right hand upper part of the drawing and which, by being inverted via the inverter IV, also controls the gates of the first transfer transistors T11, T12, T1p. The short intervals T between conversions may also be referred to as compensating times, because dynamic compensation is effective during these intervals.

Accordingly, during the intervals T between conversions, the second and the third transfer transistors are rendered conductive while the first transfer transistors are rendered non-conductive, with it being supposed with respect to the example of embodiment shown in the drawing, that the transistors as used therein, are p-channel transistors of the enhancement type. Accordingly, across the respective resistor R'1, R'2, R'p the voltage at the respective inverting input of the comparators K1, K2, Kp is adjusted to the voltage value at the associated voltage-divider tap inclusive of the respective offset voltage of the comparators, because via the second transfer transistors, the non-inverting input is applied to this potential point which otherwise, however, is applied to the signal input SE. In this way, the respective capacitor C1, C2, Cp is charged to the offset voltage of the associated comparator.

During the conversion times t, hence during the times of analog-to-digital conversion, the second and the third transfer transistors are non-conductive and the first transfer transistors are conductive, so that the input signal is switched to the non-inverting input, and the inverting input is retained at the potential of the voltage-divider tap inclusive of the respective offset voltage, so that the capacitors C1–Cp, during the conversion times t, form a source of compensating voltage for the associated comparators K1–Kp.

A rough estimate of the preferred use in connection with television receivers, by employing the aforementioned numerical values, and in the case of a 7-bit parallel A/D converter, based on a conversion time of $t \approx 60$ $\mu s$ and on a voltage variation admitted during this time, at the respective capacitance of $dU \approx 0.25$ mV, which corresponds approximately to 10% of the portion of the reference voltage associated with the least significant bit, as well as on a leakage current sum of the respective comparator input transistor and of the third transfer transistor $I_L \approx 10$ pA, results in the following capacitance value:

$$C = (t/dU) I_L \approx 2.5 \text{ pF}.$$

Capacitances in this order of magnitude can be realized without further ado by employing the MOS technique, as socalled MOS capacitors having a reasonable surface space requirement.

I claim:

1. Monolithic integrated parallel analog-to-digital converter (MOS parallel A/D converter) employing insulated-gate field-effect transistors, comprising $p = 2^n - 1$ comparators (K1, K2, Kp), a voltage divider applied to a reference voltage (Ur), consisting of p or p−1 resistors (R1, R2, Rp), and a decoder part (DC) connected to the outputs of said comparators, with n being indicative of the number of binary positions of the digital converter output signal, and with all comparator inputs of the one kind (+) being coupled to the signal input (SE) and with the comparator inputs of the other kind (−) being coupled to one voltage divider tap each, characterized by the following features:

- each non-inverting comparator input (+) is applied via the controlled current path of a first transfer transistor (T11, T12, T1p) to the signal input (SE) and, via the controlled current path of a second transfer transistor (T21, T22, T2p) to the associated voltage divider tap,
- each inverting comparator input (−) is applied via a capacitor (C1, C2, Cp) to the associated voltage divider tap,
- each comparator output is applied across a resistor (R'1, R'2, R'p) and via the controlled current path of a third transfer transistor (T31, T32, T3p) as arranged in series therewith, to the inverting comparator input (−),
- the gates of the second and of the third transfer transistor (T21, T31; T22, T32; T2p, T3p) are connected with each other and are applied to a clock signal (F) by which they are rendered conductive only during a short interval (T) between conversion, and
- the gates of said first transfer transistors (T11, T12, T1p) are applied to said clock signal (F) via an inverter (IV).

2. A MOS parallel A/D converter as claimed in claim 1 for the use in television receivers, characterized in that the line fly-back period serves as said interval (T) between conversions, and that the line sweep period serves as the conversion time (t).

* * * * *